United States Patent
Doffin

(10) Patent No.: US 8,665,004 B2
(45) Date of Patent: Mar. 4, 2014

(54) CONTROLLING A MOS TRANSISTOR

(75) Inventor: Hugues Doffin, Creteil (FR)

(73) Assignee: Valeo Equipements Electriques Moteur, Creteil (FR)

( * ) Notice: Subject to any disclaimer, the term of this patent is extended or adjusted under 35 U.S.C. 154(b) by 1251 days.

(21) Appl. No.: 12/159,670

(22) PCT Filed: Jan. 4, 2007

(86) PCT No.: PCT/FR2007/050610
§ 371 (c)(1),
(2), (4) Date: Jul. 2, 2009

(87) PCT Pub. No.: WO2007/083048
PCT Pub. Date: Jul. 26, 2007

(65) Prior Publication Data
US 2009/0302927 A1    Dec. 10, 2009

(30) Foreign Application Priority Data

Jan. 23, 2006 (FR) ................................. 06 00571

(51) Int. Cl.
*H03K 17/687* (2006.01)
(52) U.S. Cl.
USPC .......................................... 327/434; 323/285
(58) Field of Classification Search
USPC ................... 327/419, 427, 434–437, 108; 323/282–285, 299, 351
See application file for complete search history.

(56) References Cited

U.S. PATENT DOCUMENTS

| 5,543,739 A | 8/1996 | Bontempo et al. |
| 5,939,909 A * | 8/1999 | Callahan, Jr. ................. 327/108 |
| 6,194,884 B1 | 2/2001 | Kesler et al. |

FOREIGN PATENT DOCUMENTS

| DE | 42 23 274 A1 | 1/1993 |
| EP | 0 620 644 A1 | 10/1994 |

* cited by examiner

*Primary Examiner* — Lincoln Donovan
*Assistant Examiner* — Diana J Cheng
(74) *Attorney, Agent, or Firm* — Berenato & White, LLC

(57) ABSTRACT

A device for controlling (10) a power transistor (5), comprises: an amplifying device (15) for monitoring the transistor gate (5) via an output control signal, the device including: a first input connected to the transistor drain, the whole assembly forming a first circuit portion; a second input connected to the transistor source, the whole assembly forming a second circuit portion. The control device comprises means for producing a polarizing current (I1, I2), the current being injected into the first and second inputs (NEG, POS) so as to offset the drain-source voltage measurement and maintain a linear operating mode of the output control signal, prior to opening the transistor, and the same number of N semiconductor junctions in the first and second circuit portions. The device is applicable in particular on battery charging devices.

30 Claims, 5 Drawing Sheets

CONTROLLING A MOS TRANSISTOR

CROSS-REFERENCE TO RELATED APPLICATIONS AND CLAIM TO PRIORITY

This application relates to International Application No. PCT/FR2007/050610 filed Jan. 4, 2007 and French Patent Application No. 0600571 filed Jan. 23, 2006, of which the disclosures are incorporated herein by reference and to which priority is claimed.

The present invention concerns the control of a transistor, and more particularly a device for controlling a power transistor (MOSFET).

A control device of this type is for example used in the context of charging batteries in parallel. As illustrated in FIG. 1, a control unit 1 controls the charging of the batteries 2 and 3 by means of power MOS transistors 4 and 5, the conduction paths of which are disposed in series. The battery 2 is for example connected to an alternator 6, starter or alternator starter, and the battery 3 to loads, not shown, such as an onboard system. The battery 3 is connected in parallel with the battery 2 by means of transistors 4 and 5, the transistor 4 being disposed on the battery 2 side and the transistor 5 being disposed on the battery 3 side. These transistors are controlled by the control unit 1 as switches, for example on the basis of an external control signal. The transistors 4 and 5 are connected so that their parasitic diodes are arranged in opposite orientations with their cathodes turned respectively towards the battery 2 and towards the battery 3. Thus, when the two transistors are in the off state (open), no current can flow from one battery to the other.

To charge the battery 3 by means of the alternator 6, the control unit 1 must switch the transistor 4 to the on state (closed). The transistor 5 is kept in the open state, its parasitic diode preventing reverse flow from the battery 3 to the battery 2. The charging current delivered by the alternator 6 charges the battery 2 and passes through the internal diode of the transistor 5 towards the battery 3, causing a significant voltage drop, around 0.7V, because of the threshold voltage of the diode. The two batteries 2, 3 are therefore not charged with the same voltage, the battery 2 being more charged than the battery 3 at this moment.

However, on the one hand, the voltage at the terminals of the battery 3 must be greater than the minimum charging voltage, approximately 13V, in order to be able to recharge it, otherwise it is damaged. On the other hand, it is necessary to impose, at the terminals of the battery 2, a voltage lower than the maximum charging voltage, approximately 15V, otherwise it is also damaged.

To meet the two conditions, it is necessary to recharge the two batteries with the same voltage by virtue of the alternator or alternator starter 6.

In addition, the losses in the internal diode of the transistor, equal to the product of the threshold voltage and the current passing through the diode, are high, which causes heating or in the worst case damage to the transistor 5.

The purpose of the present invention is in particular to mitigate these drawbacks, namely to reduce the Joule losses and to reduce the voltage drop at the terminals of the transistor.

The invention proposes a device for controlling a transistor that limits Joule losses and reduces the voltage drop at the terminals of the transistor.

The invention thus proposes a device for controlling a power transistor formed by a channel comprising a gate, a source and a drain, the said device comprising:

an amplification device delivering an output control signal in order to control the gate of the power transistor, the said amplification device comprising:
a first input connected to the drain of the transistor, the whole forming a first circuit portion, and
a second input connected to the source of the transistor, the whole forming a second circuit portion.

In accordance with the invention, the control device comprises:
a means for producing a biasing current, the said current being injected into one of the said first and second inputs so as to cause an offset in the measurement of the drain-source voltage and to preserve a linear operating mode of the said output signal, before the opening of the transistor, and
the same number N of semiconductor junctions in the first and second circuit portions.

Thus, as will be seen in detail, the losses in the transistor are limited by virtue of the linear-mode control, and a very low measurement offset, well controlled for temperature, is obtained by virtue of the same number of junctions.

In various non-limitative embodiments of the control device, it is if necessary possible to have recourse also to one or all of the following provisions:
The control device also comprises a feedback loop from the output to one of the first and second inputs.
The first input is connected to the drain of the transistor via a first resistor.
The junction or junctions on the first circuit portion is of the same nature as that or those on the second circuit portion.
The number of n-channel junctions is equal to 0.
The number of n-channel junctions is equal to 1.
The control device also comprises two means for producing two biasing currents, the two currents being injected at the inputs of the amplification device.
The control device also comprises a protection device on the first circuit portion.
The control circuit also comprises a protection device on the second circuit portion.
The two biasing currents pass respectively through the protection devices of the first and second circuit portions.
The biasing current is integrated in the application device.
The control device also comprises a protection device on the feedback loop.
A protection device comprises a diode.
A protection device comprises a switch.
The biasing currents are produced by a current mirror.
The biasing currents are equal.
The biasing currents are different.
The first input of the amplification device is the negative input and the second input is the positive input.
The amplification device comprises a first amplification stage for amplifying the input voltage of the amplification device.
The biasing current passes through the first amplification stage.
The amplification current also comprises a second amplification stage for amplifying the voltage of the first amplification stage.
The amplification device also comprises a third amplification stage having a high current gain so as to control the transistor rapidly.
The said third amplification stage comprises a circuit for rapid discharge of the transistor.

The discharge circuit comprises means for discharging the gate of the transistor to substantially zero.

The said third amplification stage comprises a circuit for charging the transistor.

The amplification device also comprises an additional control stage for controlling a power transistor in two-state mode.

The two-state control stage uses the third amplification stage.

The control device is implemented in an integrated circuit comprising or not the said power transistor.

The invention also relates to a system for managing two batteries for a motor vehicle, having a control unit comprising a power transistor control device, the said unit being intended to put the batteries in parallel, the control device being characterised according to one of the above characteristics.

The control device in the battery management system comprises a control for a power transistor in two-state mode.

The invention also relates to a power bridge for a rotary electrical machine comprising power transistors associated with phases of a stator of the said machine, each transistor being controlled by a control device according to one of the above characteristics.

The invention also relates to a rotary electrical machine comprising a device for controlling a power transistor according to one of the preceding characteristics.

The power transistor of the rotary electrical machine makes it possible to control the said machine in motor mode.

Other particularities and advantages of the present invention will emerge from the following description of non-limitative example embodiments with reference to the accompanying drawings, in which:

FIG. 1, already described, is a diagram of a first example of an application in which a device according to the invention can be used;

Figure 1:
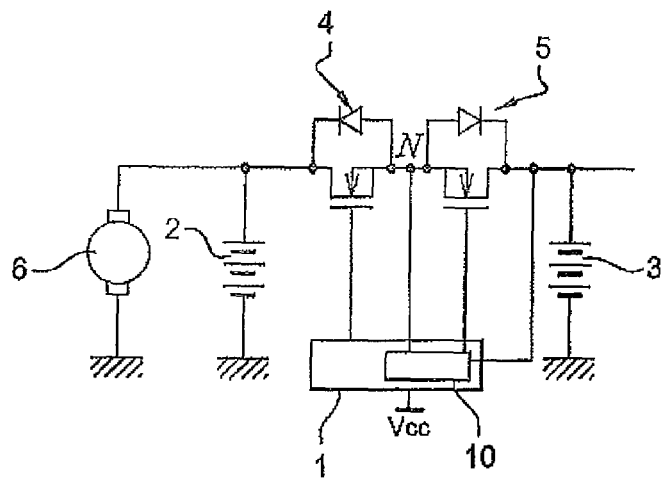

The control device 10 for a transistor can be used in the battery charging device illustrated in FIG. 1.

In the remainder of the description, it is described in the context of this application. Naturally the said application is only an example of a non-limitative application for the said control device. The said device can be used in other applications as will be seen in detail below.

The control device 10 is installed so as to autonomously control the second transistor 5, the first transistor 4 being controlled by an external signal, in two-state control mode. In a non-limitative mode, the transistor 5 is a MOSFET transistor. The same applies to the transistor 4.

Figure 4:
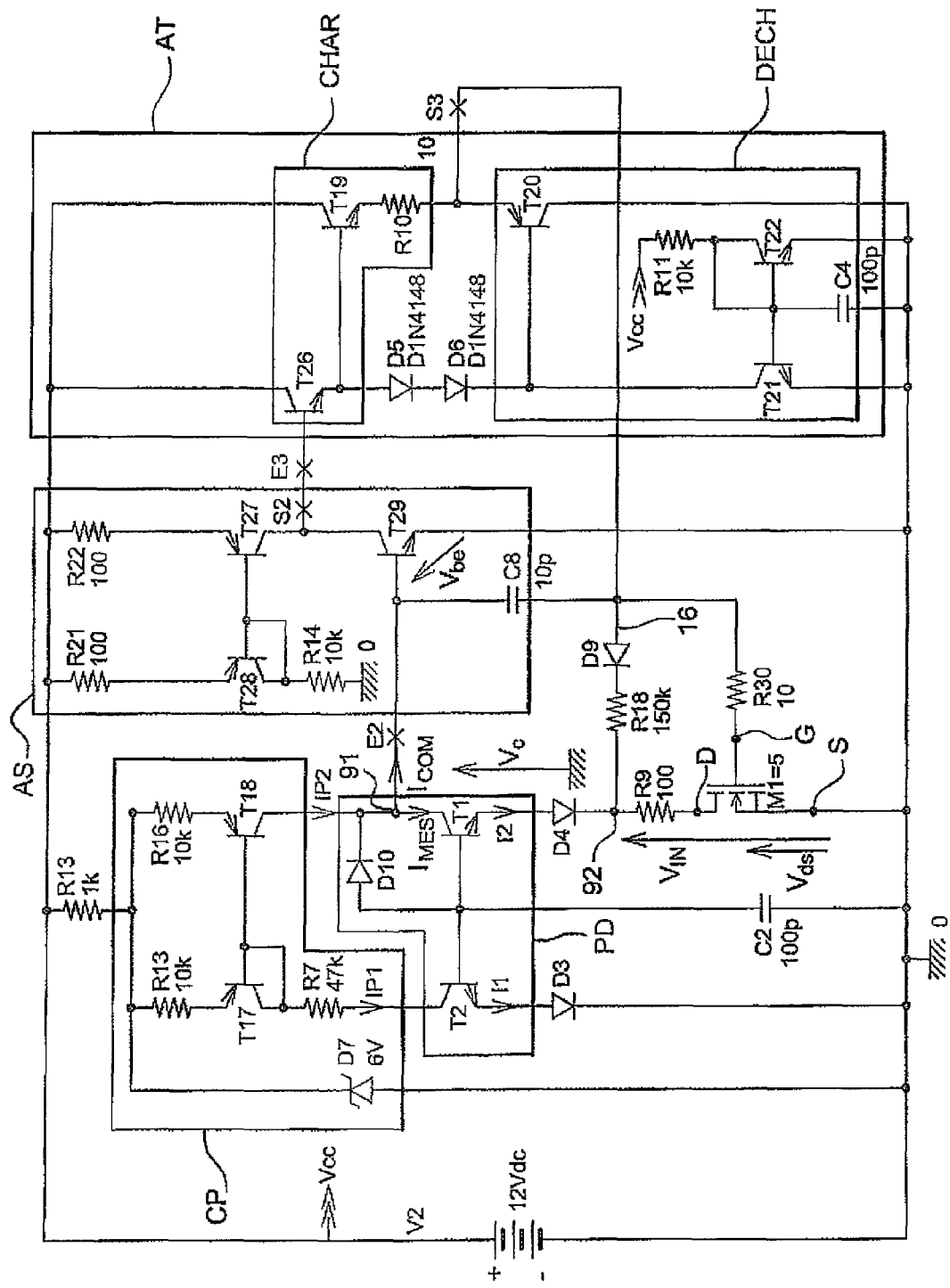
FIG. 4 is a diagram of an example embodiment of a control device for the control device according to the invention.

According to the first functional diagram in FIG. 4, the control device 10 comprises:
an amplification device 15 for controlling the gate of the transistor 5 by means of an output control signal,
a feedback loop 16 from the output of the amplification device to one of its inputs; it should be noted that this feedback loop may be not on the output but within the amplification device. This second mode stabilises the circuit of the amplification device 15 better,
at least one biasing current I1, and
a first resistor R9.

The elements are described in more detail below.

Amplification device 15

The amplification device 15 comprises:
a first input NEG (−) connected to the drain of the transistor via a first resistor R9, the whole forming a first circuit portion,
a second input POS (+) connected to the source of the transistor, here via a point N connected to a control unit 1.

In a non-limitative embodiment, the first input NEG of the amplification device 15 is the negative input and the second input POS is the positive input.

In another variant, this may be the reverse. At this time, the feedback loop 16 comprises a switch.

Feedback loop 16

In a non-limitative example embodiment, the feedback loop comprises:
a first resistor R9,
a second resistor R18.

In a non-limitative embodiment, the feedback loop 16 is coupled to the negative input NEG of the amplification device 15. This feedback loop makes it possible to control the transfer function of the amplification device 15, in particular the gain, by re-injecting a feedback current Iret.

In a non-limitative embodiment, the said loop 16 also comprises a diode D9 protecting against a high drain voltage, here 12V, and against a leakage current coming from the drain that might discharge the battery 3.

Biasing current

The biasing current I1 is coupled to one of the inputs of the amplification device 15. In a non-limitative embodiment there are two biasing currents I1, I2 coupled respectively to the two inputs NEG, POS of the amplification device 15.

Figure 3:
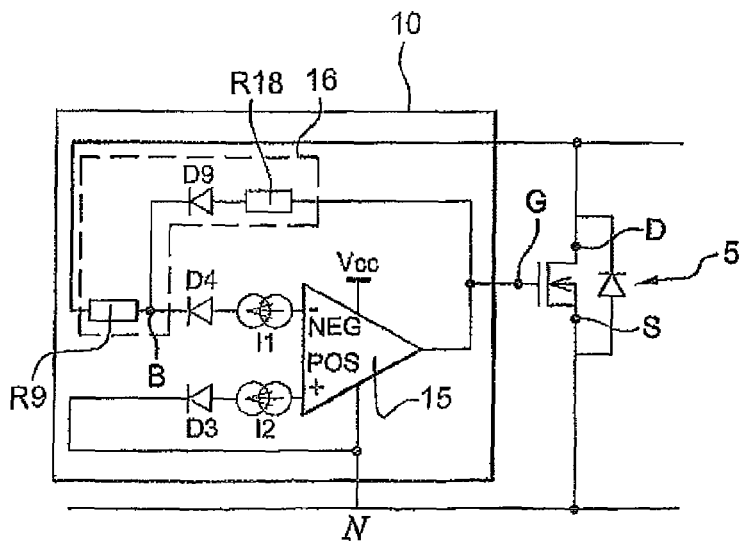
FIG. 3 is a second functional diagram of the device according to the invention.

In addition, in a non-limitative preferential embodiment, the biasing currents I1, I2 are integrated in the amplification device 16, as indicated in FIG. 3. They will thus also serve for the amplification performed by the amplification device 15, as will be seen in detail below. Thus it is not necessary to add an external circuit.

In a non-limitative embodiment, the biasing currents I1, I2 are produced by two current sources.

In another variant, the said currents can be produced by a resistor connected to a fixed potential.

Resistor R9

The biasing currents I1, I2 make it possible, in combination with the resistor R9, to offset the drain-source voltage measurement so that the amplification device 15 opens (zero gate-source voltage Vgs) the transistor 5 when its drain-source voltage is zero Vds. Thus, in order to obtain this voltage offset, either the biasing currents or the value of the resistor R9 is made to vary.

For the battery application, in an example embodiment, the offset of the voltage measurement is situated between 30 mV and 40 mV, as will be seen in detail below. It should be noted that this resistance R9 may be equal to zero. In this case, the feedback loop is situated within the amplification device, as will be seen subsequently in detail in a third functional diagram illustrated in FIG. 8.

Protection device D

In a non-limitative preferential embodiment, the control device 10 also comprises a protection device D coupled to an input of the amplification device 15 in order to prevent the passage of a leakage current from the drain into the feedback loop 16 and into the amplification device 15.

Such a protection device D may comprise:
either, in a non-limitative embodiment, three diodes D4, D3, D9 respectively on each of the inputs NEG, POS before the point B (the point connecting the first resistor R9 to the first input NEG of the amplification device) and the feedback loop 16, as illustrated in FIG. 3,
or a switch (not shown) replacing each diode mentioned above,
or solely a switch on the first circuit portion, between the drain and the first resistor R9. This switch combined with the biasing current I1 leaving the amplification device 15 and going towards the drain makes it possible to perform the following function:
When the switch is closed, the system functions like the circuit described in FIG. 3.
When the switch is open, the biasing current, which can no longer pass through the first circuit portion, opens the MOS since the potential at the negative input NEG becomes greater than the potential of the positive input POS of the amplification device 15.

It should be noted that the said diodes D4, D3, D9 are placed where there are leakage currents when the device is switched off. Thus the arrangement in FIG. 3 is a preferential case among others. For example, it would be possible to have the diodes D4, D3 directly connected to the source and to the drain of the transistor 5 after the node B (before or after the resistor R9) while the feedback loop 16 would be directly connected to the amplification device 15.

It will also be possible to replace the diodes with MOSFET transistors.

The two biasing currents I1, I2 pass respectively through the two diodes D4, D3 connected to the two inputs NEG, POS of the amplification device 15.

In a first embodiment, the biasing currents are adjusted so as to have the same conduction voltages in the said diodes and in the transistors T2 and T1 (described below) of the amplification device 15 so that the said diodes and the amplification device 15 do not cause any voltage shift. In this way the complementary shift "offset" which would further offset the drain-source voltage measurement of the transistor 5, is eliminated. This additional uncontrolled offset could in fact cause an error on the drain-source voltage that it is wished to obtain. It is for example possible to take biasing currents I1 and I2 identical and constant for any supply voltage of the control device, and the diodes D3 and D4 identical.

In a second embodiment, the biasing currents are adjusted so as to have this time a supplementary controlled shift "offset" that varies according to the temperature of the diodes and the amplification device 15 (in particular the transistors T2 and T2 described below).

This offset is chosen according to the variation in temperature of the internal resistance of the MOS transistor 5. It is chosen so that it increases when the temperature increases. This second mode thus makes it possible to obtain functioning in linear mode before the opening of the MOS transistor 5 even at high temperatures since the transistor has its internal resistance increasing with temperature. Consequently the moment when the gate of the transistor 5 is discharged is advanced. Thus the gate of the transistor 5 has time to discharge correctly before the current reverses in the said transistor 5 In this way electromagnetic parasites are limited. It is possible for example to take biasing currents I1 and I2 that are different and diodes D3 and D4 that are identical.

Thus the control of the gate in linear mode is more effective than two-state control. Since one of the problems of two-state control by a comparator is that, when the transistor is on and the drain-source current Ids is low, the drain-source voltage becomes very low, which gives rise:
either to oscillations since this is at the limit of the offset of the comparator,
or to a current that can flow from the battery 3 to the battery 2.

Oscillations are avoided by controlling the gate of the transistor so as to adapt its channel to the drain-source current Ids that passes through it.

Figure 2:
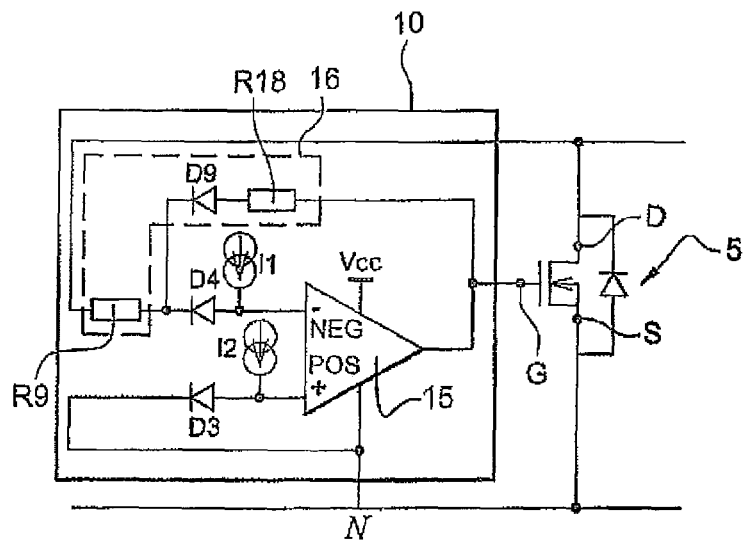
FIG. 2 is a first functional diagram of the device according to the invention.

Thus, by virtue of the diodes D3 and D4, and possibly the associated biasing currents I1 and I2 (the case of FIG. 2 for example where the currents are external to the amplification device 15), an equal number N of semiconductor junctions are obtained between the drain and source inputs of the transistor 5 and the first stage of the amplification device 15. Therefore here N=1. This thus makes it possible to have a very low drain-source voltage measurement offset (around 40 mV) with respect to the voltage of a diode (around 0.7V). There are therefore fewer Joule losses and therefore better efficiency of the machine. It should be noted that N may be equal to 0 in the case where there are no protection diodes D3 and D4, but only the resistor R9 with at least the biasing current I1. Even in this case, there are an equal number of junctions.

In addition, by choosing components of the same nature on the two inputs (diode D4-diode D3 and current I1-current I2), it is easily possible to choose them with the same characteristics and therefore obtain good symmetry on the two inputs. This makes it possible easily to adjust the drain-source voltage measurement offset, either according to temperature (when I1 is different from I2) or to a given constant value (I1 equals I2).

Consequently, by virtue of the equal number of semiconductor junctions and this symmetry (components of the same nature) it is easy to choose the measurement offset even with a very low value without supplementary offset voltages coming from the said chosen components and generated by temperature drifts occurring.

FIG. 4 presents a non-limitative example embodiment of the control device 10 and its elements mentioned previously. Its elements are thus described in detail below according to this example embodiment.

Amplification device 15

The amplification device 15 comprises:
a first amplification stage PD,
a second amplification stage AS, and
a third amplification stage AT.

These three elements are described in detail below.

first amplification stage PD:

This amplifies the input voltage Vin of the amplification device 15, that is to say the drain-source voltage plus the voltage at the terminals of the first resistor R9.

The first stage PD comprises two transistors T1, T2, the bases of which are connected to each other. This in order to make this first stage symmetrical, so that there are no offsets between the base-emitter voltages plus diode voltages of the arms of the two associated transistors and diodes D4, D3.

In a non-limitative embodiment, these transistors are bipolar transistors and npn. They can be chosen according to pnp technology if so wished.

In another variant, these transistors are Jfets.

In addition, in a non-limitative embodiment, the biasing voltages I1, I2 pass through the third stage PD, as illustrated in FIG. 4.

Thus the emitters of the transistors T1, T2 of the first stage send the biasing currents I1, I2 into the diodes D4, D3 of the protection device D.

This has the following advantages:

This makes it possible to obtain a high current at the input of the stage PD, of around 100 μA for the battery application in particular. Thus this simplifies the diagram of the amplification device since it is not necessary to amplify the current at the same time as the input voltage Vin (a high current being necessary to control the transistor 5, around 1A), and therefore it is not necessary to have additional components for amplifying the said current, in addition, the same current is used for making the voltage shift "offset" and the amplification of the input voltage Vin (a biasing current I2 being situated partly in the resistor R9). In this way an excessively great consumption of current is avoided, which would occur if two distinct currents had been taken, using a high current for the input of the amplification device 15 avoids being sensitive to the parasitics due to the circuit portions between the transistor 5 and the control device 10, thus avoiding having additional filtering components such as a filtering capacitor, and by virtue of the high current, the dynamic resistance of the diodes D4, D3 is lower, and therefore the frequency response of the stage PD is more rapid so that the mounting of the control device in its assembly is quicker.

It should be noted that the differential pair PD also comprises, in a non-limitative embodiment:

a diode D10 connected between the collector and base of the first transistor T1 of the first stage, which prevents saturation of T1, which could cause a delay during a rise in the collector voltage.

Second amplification stage AS:

The second amplification stage AS once again amplifies the input voltage Vin=Vds+R9* (I1+Iret). It thus increases the voltage gain.

The said second stage AS comprises, in a non-limitative embodiment:

a third transistor T29, a current source for biasing the transistor T29.

This third transistor T29 limits the output voltage Vc of the first stage (collector voltage of T1). In a non-limitative example, this limit is fixed at 0.7V.

Thus, if there is a drain-source voltage Vds between −1V and −0.04V, the output voltage Vc of the first stage PD varies between −1V and 0.7V (without diode D4), and between −0.3V and 0.7V (with diode D4 present).

Therefore it can be seen that, with the protection diode D4, the output voltage Vc is closer to the voltage Vbe (approximately equal to 0.7V) of the third transistor T29 so that, when this transistor T29 goes from one state to another (open/closed), it does so more rapidly. This gain in speed is transferred to the control of the transistor 5.

It should be noted that it is possible to introduce a capacitor C8 between the base of the third transistor T29 and the gate of the transistor 5 in order to stabilise the last amplification stages in it.

It should be noted that the current source can be implemented by a current mirror T28-T27-R14 with the advantages cited below with two associated resistors R1, R2 in order to attenuate the differences between the components of the mirror.

Third amplification stage AT:

The third amplification stage AT delivers an output current sufficient to rapidly charge or discharge the gate G of the transistor 5. The said third stage thus comprises means DECH for discharging the gate G of the transistor 5 to substantially zero in order to be sure that the transistor 5 does indeed manage to open when the control device 10 attempts to open it, otherwise it may blow.

In addition the third stage comprises charging means CHAR.

The said discharge means DECH comprise, in a non-limitative embodiment:

a current mirror T21-T22-R11, with which a capacitor C4 is if necessary associated for stability, and a fourth transistor T20 having, in a non-limitative example, a gain of at least 100.

The current mirror T21-T22-R11 is useful for consuming less compared with a simple resistor.

The charging means CHAR comprise:

a fifth transistor 19 with a resistor R10 serving as protection against an overcurrent, and a sixth transistor T26.

The third stage AT also comprises, in a non-limitative embodiment:

diodes D5 and D6, and an output resistor R30 for adjusting the stability of the control device 10.

The diodes D5 and D6 enable the fifth and sixth transistors T19 and T20 to conduct at the same time, which limits delays and oscillation problems.

It should be noted that the transistor 5 is charged rapidly by virtue of:

the obtaining of high currents, for example 0.2 to 1A, the third stage AT having, in a non-limitative embodiment, a high current gain, here around 1000, T26 and T19 having a gain of around 100, and the speed of the preceding stages PD and AS, and the follower circuit comprising the transistors T6 and T19.

It should be noted that the transistor 5 discharges rapidly by virtue of:

the obtaining of high currents, for example 0.2 to 1A, the third stage AT having, in a non-limitative embodiment, a high current gain, and T20 having a gain of around 100, and the speed of the preceding stages PD and AS, and the current mirror T21-T22-R11 in combination with the fourth transistor T20, the said combination affording a more rapid discharge compared with a simple resistor, which could not be low without consuming too much current.

It should also be noted that the combination of current mirror T21-T22-R11 with the fourth transistor T20 makes it possible to discharge the gate of the transistor as far as substantially zero, here 0.7V=Vbe of the fourth transistor T20. Thus the influence of the Miller effect well known to persons skilled in the art, which creates a voltage pulse on the gate of the transistor 5 when the drain-source voltage Vds varies rapidly, is limited. This pulse may cause an undesired switching or interfere with the control of the said transistor 5.

Biasing currents

In addition, it should be noted that the current sources CP producing the biasing currents I1, I2 are implemented by, as illustrated in FIG. 4:

a current mirror T17-T18-R7, and in a non-limitative embodiment, two resistors R13 and R16 associated with the said mirror in order to attenuate the differences between the components of the mirror. It should be noted that these resistors may have a high value since there is no need for a high output voltage Vc at the output of the first amplification stage PD, as will be seen subsequently.

Thus, by virtue of the current mirror, the first current I1 is produced from the second current I2. The biasing currents are therefore simple to produce. In addition, this makes it possible to have the same conduction voltages in the said protection diodes D3, D4.

Figure 9:
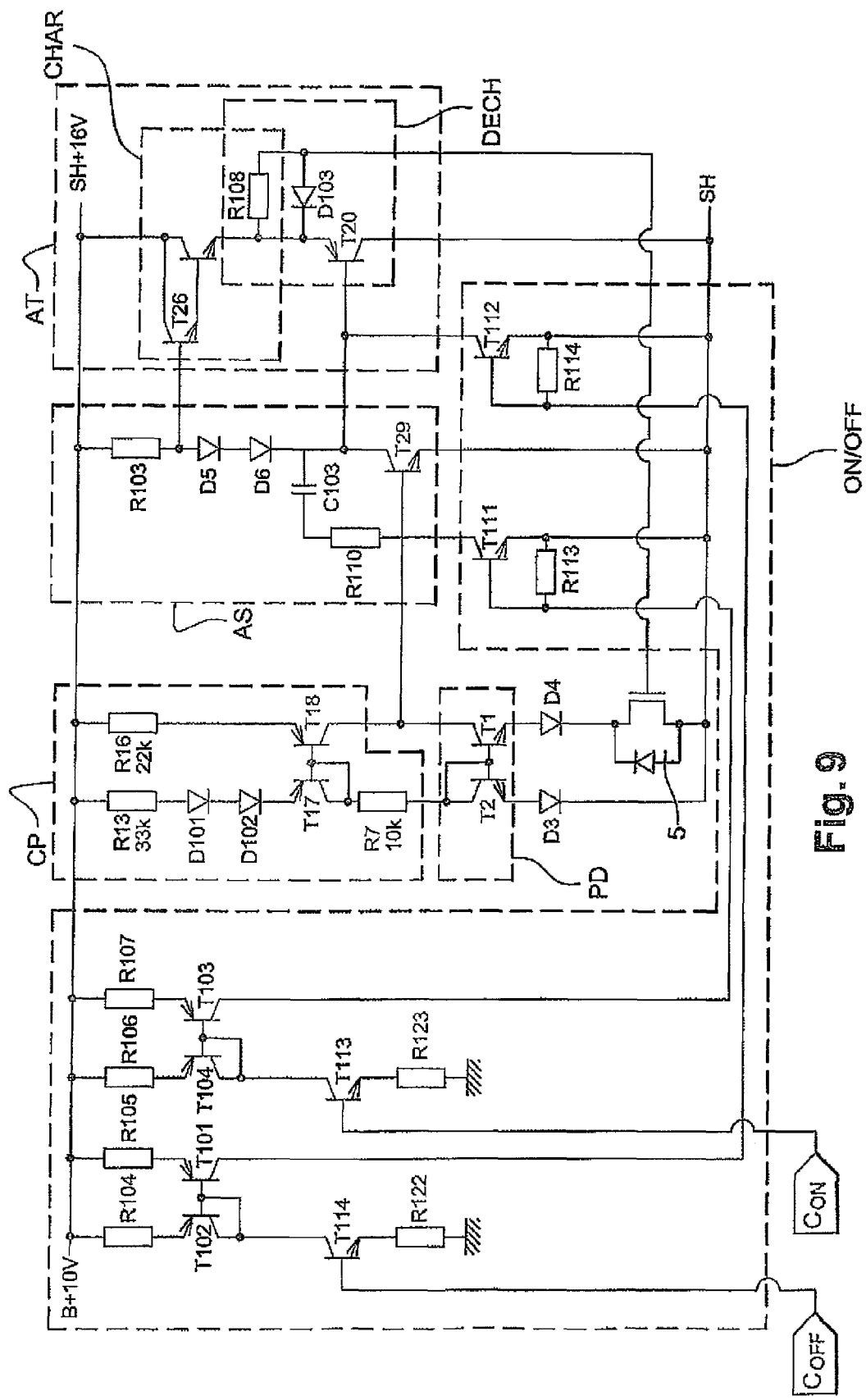
FIG. 9 is a diagram of an example embodiment of a control device according to the invention.

It should be noted that, in one embodiment, provision can be made for a current source to be manufactured from a voltage source, here represented by a Zener diode D7 so as to have a fixed value of the voltage measurement offset, here between 30 mV and 40 mV. In the contrary case, this offset varies according to the supply voltage Vcc, which is here 12V. It should be noted that the current source can be implemented by adding one or more diodes in series with the resistor R13 so as to guarantee a voltage measurement offset that does not tend towards zero when the supply voltage Vcc decreases to zero so that the device does not control the transistor 5 in an unwanted fashion when the supply voltage is low, approximately 3V for example. This implementation is illustrated in FIG. 9.

Feedback loop 16

In addition, the feedback loop 16 comprises non-limitatively:

a resistor R18 affording a limitation in the gain in the said loop to approximately 1000 with the given values (R18/R9) making it possible to stabilise the system.

Thus there is a total gain in the control device 10 that is a function of this ratio of resistances R18/R9 and which is therefore almost fixed.

Figure 5:
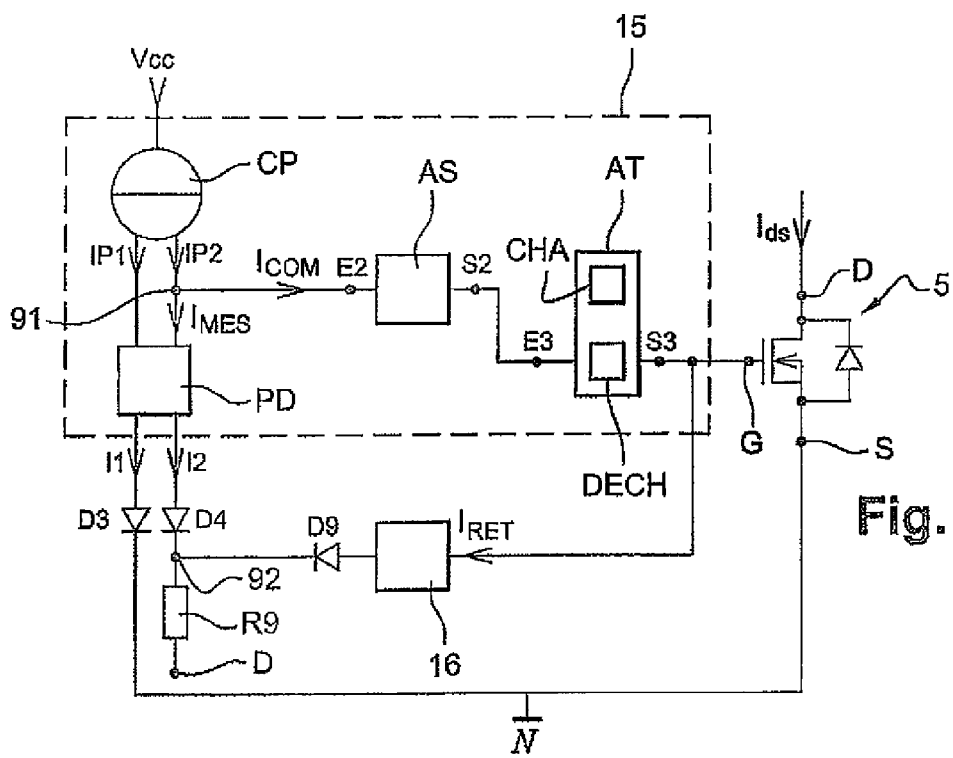
FIG. 5 is a simplified diagram of the example embodiment in FIG. 4.

With reference to FIG. 5, the connections of the various elements of the amplification device 15 are made as follows.

The current sources CP are supplied by a supply terminal raised to a supply voltage Vcc. They are also connected, at the node 91, to a measuring arm comprising the first stage PD and to a control arm comprising the second amplification stage AS.

The first stage PD also comprises an output connected to the protection diodes D4, D3.

The second amplification stage AS comprises an input E2 connected to an output of the first stage PD, at the node 91, and an output S2 connected to an input E3 of the second amplification stage AT.

The third amplification stage At comprises an output S3 connected to the gate G of the transistor 5.

Finally, the feedback loop 16 is connected firstly to the gate G of the transistor 5 as described previously and secondly to the measuring arm at the node 92.

In addition, the currents passing through the various elements of the amplification device 15 are illustrated as follows.

At the node 91, the biasing current IP2 is equal to the sum of the currents Imes and Icom passing respectively through the measuring arm and the control arm, and IP1+Imes=I1+I2.

It should be noted that, loosely speaking, the output currents IP1, IP2 of the current mirror and the currents I1, I2 coming from the emitters of the first and second transistors T1, T2 have been referred to indifferently as biasing currents.

The control arm thus has the control current Icom passing through it, while the feedback loop 16 has the feedback current Iret=Ugate/R18 passing through it.

The functioning of the control device 10 is described below. It is described in the context of a functioning of a switch connecting two batteries. This functioning is a non-limitative example.

At the batteries:

In a first step INIT), in an initial state, the system described in FIG. 1 is idle and no current passes between the two batteries. This configuration corresponds to a vehicle at rest without any electrical consumer.

In a second step +APC), when the user turns the ignition key, a current (approximately 20A) is consumed on the battery 3. This current produces a voltage drop at the terminals of the said battery and the control device 10 drives the transistor 5 so as to reduce the voltage drop.

In a third step +DEM), when the user starts the thermal engine by means of a starter or alternator starter, the current is take from the battery, for example around 600A. This high current makes the voltage at the terminals of the battery 2 drop considerably (from 12V to 6V for example). To prevent this voltage drop disturbing the onboard system connected to battery 3, it is desirable for the control device 10 to open the transistor 5 quickly. Quick control also protects the transistor against any risk of high thermal overheating that might blow the said transistor. It should be noted that the transistor 4 is controlled by means of an external signal.

In a fourth step ALT), when the thermal engine is started, the alternator or alternator starter supplies current for recharging the batteries 2 and 3, and the transistor 5 must close in order to avoid heating and to maintain the same charging voltages on the two batteries, without which the battery 2 will be more highly charged that the battery 3.

The above steps are described in more detail below.

At the control device 10

In the first step INIT), the control unit I and therefore the control device 10 are not supplied, the two transistors 4 and 5 are not actuated. The gate voltage Vg=0. The voltages of the two batteries 2 and 3 are around 12.8V.

In the second step +APC), the control unit 1 is supplied by Vcc and therefore the control device 10 also. The transistor 4 is therefore controlled and on. The voltage of the battery 3 becomes lower (12.5V) than that of the battery 2, this voltage drop has an effect on the drain-source voltage Vds of the transistor 5 and is negative, around −0.3V for example. The drain-source current Ids is almost zero.

The gate voltage Vg being zero, the feedback current Iret is zero.

The biasing current I2 passes through the first resistor R9, that is to say there is a voltage VR9 of approximately 60 mV, which is small compared with Vds.

As the base-emitter voltage Vbe=0.7V, the transistor T1 conducts fully and Vc=Ve=0.4V.

The input E2 of the second stage AS therefore goes to 0.4V and the third transistor T29 does not conduct.

Therefore the input E3 of the third stage AT goes to Vcc−0.7V, and the gate of the transistor 5 is charged by the charging means CHAR (T26 and T19 become conducting, which charges the gate of the transistor 5). The said transistor is thus closed.

At this moment, the drain-source current Ids increase up to approximately 10A in absolute value (−10A), the current consumed on each of the batteries 2 and 3 now being approximately 10A on each.

At this moment also, the feedback loop 16 injects a feedback current Iret into the first stage PD. This current improves the stability of the control device 10.

It should be noted that the variation slope for the drain-source current Ids depends here on the inductances in the wiring connecting the two batteries.

In the third step +DEM), the voltage of the battery 2 becomes lower (6.5V) than that of the battery 3 (12.5V), this voltage drop has an effect on the drain-source voltage Vds of the transistor 5 and is positive, approximately 6V for example.

The feedback current Iret passes through the first resistor R9, the resulting voltage being negligible compared with 6V.

The first transistor T1 is completely open.

The biasing current IP2 no longer passes through the transistor T1, therefore Icom=IP2 and therefore the third transistor T29 is on.

The input E3 of the third stage At becomes zero and therefore the transistors T26 and T19 are off.

Consequently the gate discharges into the discharge device DECH. The transistor 5 opens and the drain-source current passes from 10A to 0A in absolute value (−10A to 0A).

No current flows from the battery 3 to the battery 2. There has therefore been no dropout on the system connected to the battery 3, such a dropout being able to switch certain items of equipment. The onboard system has therefore been protected.

It should be noted that the variation slope for the drain-source current depends here on the inductances of the starter.

In a fourth step ALT), the alternator regulates the voltages at its terminals, at 14V, which charges the battery 2 to 14V. The voltage difference Vds is 0.8V due to the passage of the current through the diode of the transistor 5. The battery 3 is therefore recharged to 13.2V. However, it is necessary to recharge it to 14V, which the control device 10 does autonomously as indicated in the second step +APC. When high-power consumers exist on the onboard system, the drain-source current Ids increases in absolute value up to approximately 100A and the gate-source voltage Vgs reaches its maximum value, approximately Vcc, the said current Ids being supplied by the alternator.

Figure 6:
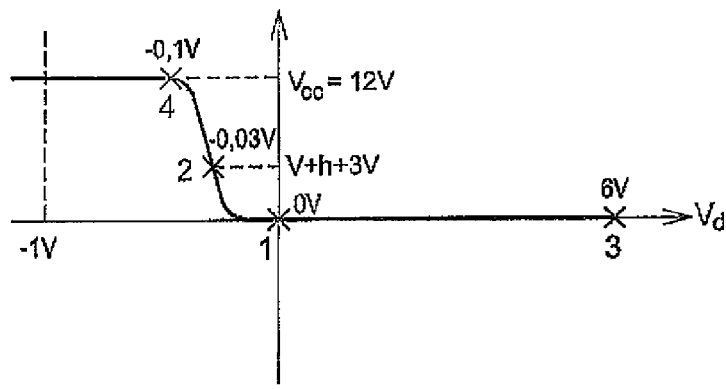
FIG. 6 depicts a curve of the gate-source voltage as a function of the drain-source voltage of a transistor controlled by the control device according to FIG. 5.

The gate-source voltage Vgs is shown as a function of the drain-source voltage Vds in FIG. 6. On this curve, the various steps described previously are shown in stabilised mode.

The first step INIT is represented by point 1.
The second step +APC is represented by point 2.
The third step +DEM is represented by point 3.
The fourth step ALT is represented by point 4.

It can thus be seen that the control device 10 and therefore the amplification device 15 functions in linear mode during the second step +APC, that is to say before opening the transistor 5. This makes it possible to increase the speed of opening of the transistor compared with a case where the gate-source voltage Vgs is equal to Vcc (transistor 5 completely conducting).

It should be noted that the feedback loop 16 acts in the following manner for the second +APC and fourth ALT steps. The feedback current Iret, as a function of the gate voltage Vg, is re-injected into the amplification device 15 so that the gain of the amplification device 15 is limited, around 1000, thus improving the stability of the control device. Thus, when the drain-source voltage Vds is around −30 mV, a switching of the transistor in two-state mode (Vgate-source=0V or Vcc) is all the more avoided. Thus the channel of the transistor 5 is made to vary by controlling the gate-source voltage Vgs as a function of the voltages Vds and Vgs (by means of the feedback loop 16).

For the first INIT and third +DEM steps, the feedback current Iret is zero, the gate-source voltage Vgs being zero.

Thus the biasing current I1 passing through the first resistor R9 effects the voltage measurement offset of around 30 mV so that the amplification device functions in linear mode before opening the transistor 5. Without the resistance R9 (if R9=0 for example), the curve of the voltage Vgs as a function of the voltage Vds would be a curve of a comparator centred on 0. Because of this, the voltage Vgs would drop directly to 0 and the transistor 5 would not have time to open before Vds becomes positive and therefore a reversal of Ids (negative to positive).

It should be noted that the control device 10 makes it possible to control the transistor 5 in linear mode in particular as seen previously in FIG. 6.

However, it should be noted that such a device can also control a transistor in two-state control, and in particular the transistor 5. In this case, a control device 10 according to a second example embodiment is used, as illustrated in FIG. 9, which will be seen. Being able to select the type of control of the transistor 5, (that is to say linear or two state)

Figure 8:
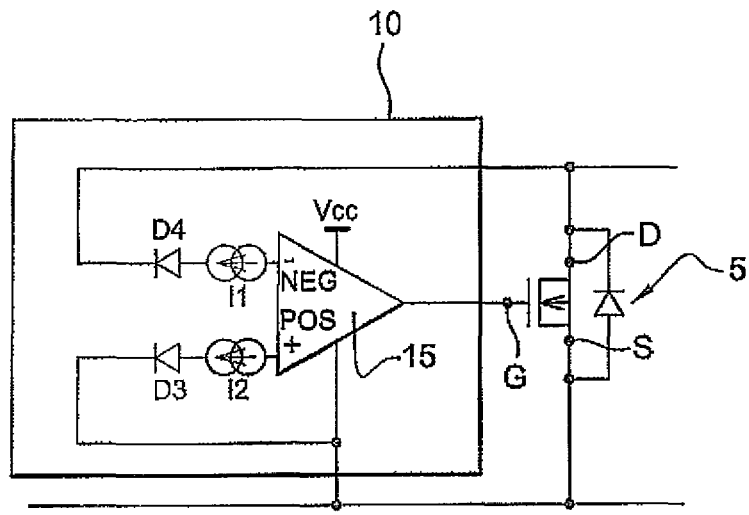
FIG. 8 is a third functional diagram of the device according to the invention.

FIG. 8 illustrates a third functional diagram of the control device in which the feedback loop is situated within the amplification device 15. This makes it possible to stabilise this device 15.

It should be noted that the example embodiment of the device described above in FIG. 4 can be used in this functional diagram also.

FIG. 9 illustrates a second example embodiment of the control device. As in the case of the first example embodiment in FIG. 4, it can be used in the three non-limitative functional diagrams in FIGS. 2, 3 and 8.

Naturally these two example embodiments can be used in other functional diagrams and other applications, in particular when it is wished to replace a diode with an ideal diode (having fewer losses), and all the more so if the current to be rectified has a low variation slope.

The second example embodiment in FIG. 9 will be described below.

The amplification device 15 also comprises:
a first amplification stage PD,
a second amplification stage AS,
a third amplification stage AT, and
a two-state control stage ON/OFF.

These four elements are described in detail below.

It should be noted that the components having the same references as in the first example embodiment in FIG. 4 are of the same type as those in this first example. They will therefore not be described.

First amplification stage PD: the diode D10 has merely been removed.
Second amplification stage AS:
This comprises:
a resistor R103 (in place of R21, R22 T27 T28 R14). It has the same function as the components that it replaces,
the diodes D5 and D6 of the third stage AT of the first example embodiment, which have been introduced into this second stage AS.
a feedback R110-C103 that makes it possible to stabilise the entire amplification device 15 more effectively than the capacitor C8 of the first example embodiment.
Third amplification stage AT:
This comprises:
a resistor R108-diode D103 assembly replacing the set of resistors R10-R30 of the first example embodiment. This resistor-diode assembly, apart from fulfilling the same function as the old assembly, prevents a voltage offset between the two transistors T26 and T20 and therefore makes it possible to control the gate of the MOS transistor 5 more quickly in particular when the gate is discharged.

It no longer comprises the sub-assembly T21-T22-R11-C4, which has been replaced by a direct connection to the transistor T29. This solution is simpler and consumes less current.

Two-state control stage ON/OFF

This comprises:

two inputs receiving a first signal GOFF for switching off the transistor 5 and a second signal CONN for switching on the transistor 5.

these voltage signals are converted into current by respectively the assemblies T114-R122 and T113-R123, two current mirrors T102-R104-R105-T101 and T104-R106-R107-T103 copy the current into the resistors of R113 and R114 so as to control the transistors T111 and T112 respectively in two-state mode.

the transistors T111 and T112 control the MOS transistor 5 in two-state mode.

It should be noted that the control stage uses the third amplification stage AT. This simplifies the electrical diagram and leaves space on the silicon when the control device is integrated on an ASIC and reduces the number of components when it is not integrated.

It should be noted that this supplementary stage can be used in the battery application described for connecting the two batteries in parallel during starting (motor mode), and in particular in very cold weather since, in very cold weather, the power available by the battery is reduced. Connecting the two batteries in parallel makes it possible to obtain an increase in power on starting.

The control device 10 according to the invention has been described in the context of the battery application described above according to the first example or the second example embodiment. Naturally the battery applications are not the only ones to which the control device 10 according to the invention relates. It can be applied to any other application in which in particular it is useful to reduce the Joule losses due to a current passing through a diode.

Thus the control device 10 can apply to a bridge rectifier, in particular the part controlling the transistor 5. In particular, non-limitatively, it applies to a bridge rectifier of an alternator or alternator starter, the bridge rectifying the current generated by the alternator in order to use it as DC for vehicle consumers.

By virtue of the two-state control stage ON/OFF of the second example embodiment of the control device, it is also possible to use the control device 10 for an inverter for controlling the electrical machine in motor mode, the said inverter making it possible to transform a direct current into an alternating current, which makes it possible to generate a motor torque.

In general such a bridge/inverter comprises three arms each comprising two MOS transistors and each being connected to a phase of the stator of the alternator or alternator starter. The control device described above is defined for a transistor 5 of an arm of the bridge/inverter. There will therefore be six control devices 10 associated with a bridge/inverter.

Figure 10:
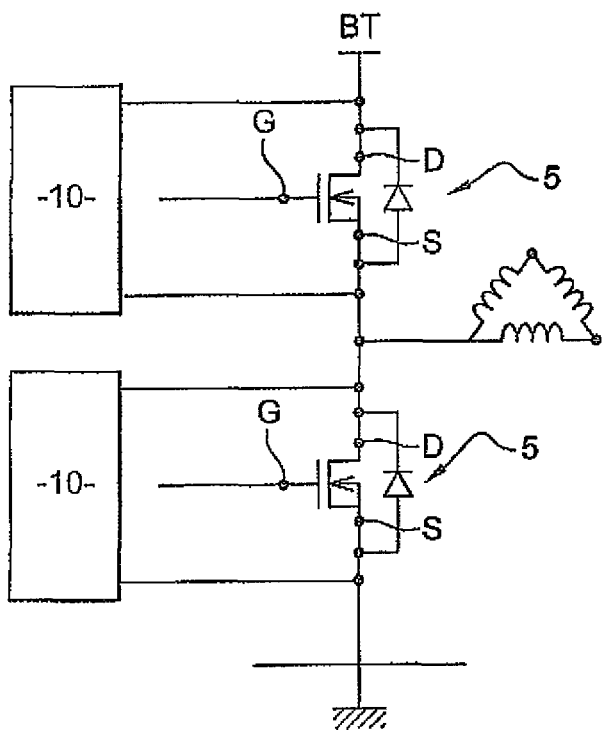
FIG. 10 is a diagram of a second example of an application in which a device according to the invention can be used.

As illustrated in FIG. 10, it can be seen that the control device 10 is connected to a phase of the alternator or the earth of the alternator depending on whether the device controls the transistor of the "low side" or "high side" of an arm of the power bridge (rectifier/inverter).

The remainder of the description relates to a bridge rectifier.

For a bridge rectifier, the initial current being alternating, it changes regularly from a negative value to a positive value. This current represents the drain-source current Ids passing through the transistor 5. Because of this, if the transistor 5 is opened too slowly, the current Ids will reverse before the said opening, which will cause oscillations on the voltage Vds. This is liable to generate electromagnetic parasitics CEM interfering with the functioning of the consumers of the vehicle.

Thus it is necessary to open the transistor 5 rapidly. The greater the slope of variation of Ids, the more rapidly it is necessary to open the transistor.

Figure 7:
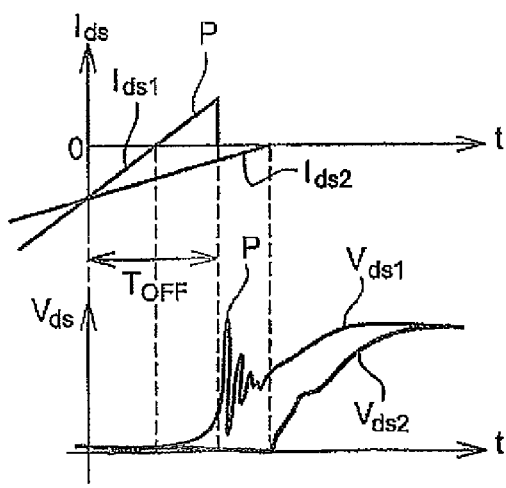
FIG. 7 depicts two schematic curves of the drain-source current and the drain-source voltage of a transistor controlled by the control device according to FIG. 5, as a function of a switching time of the transistor.

Thus FIG. 7 illustrates two different variations of the slope drain-source current Ids, Ids1 and Ids2 respectively, as a function of the time of opening of the transistor 5.

In this case a gentle slope Ids2 can be seen, the transistor 5 is open before the change in sign of the drain-source current Ids, while in the case of a steep slope Ids1, the transistor 5 opens after the said change in sign, and opens during the interval of time indicated TOFF. In the latter case, there is a current peak P followed by damping oscillations on the drain-source voltage Vds. These oscillations will be repeated at each half cycle of the initial current.

The problem of these oscillations is advantageously resolved by the control device 10 according to the invention. This is because the gate-source voltage Vgs is already close to the limit control voltage for the transistor Vth=3V before the opening of the transistor 5, since this is linear mode as seen previously. Therefore the control of the transistor 5 is more rapid to effect. The change is from a linear state to the open state instead of passing from a closed state to the open state.

It should be noted that the speed of control is improved by virtue also of the three amplification stages PD, AS and AT, as seen previously.

It should also be noted that the amplification stages can also comprise a corrector in order to further improve the dynamic characteristics of this transistor control. For example, the dynamic range and the speed of the device can be improved by means of an integration corrector or the like.

Thus the control device 10 according to the invention has the following advantages:

because of the use of currents at the input of the first stage PD (rather than voltages), this device is robust vis-à-vis interference that might disturb the control device. It is therefore possible to use such a control device in an environment subject to strong electromagnetic interference or in a noisy system.

Such a control device does not necessarily involve operational amplifiers or the like. These are limited by in particular their output voltage variation slope (normally in English referred to as "slew-rate"), their bandwidth, the conditions of use in terms of temperature, their output voltage not being able to go as low as zero volts or to 15V in order to drive the MOS transistor 5 in the totally conductive or totally open state. Thus the manufacture of such a device is not subject to limitations.

Such a control device has a simple structure. Therefore it comprises a small number of basic components and therefore can easily be integrated in an ASIC without losing too much space. This ensures a low cost, with the possibility of simple industrial production. Moreover, the fact that it takes up little space makes it possible to integrate the MOS transistor 5 easily in the same ASIC. Thus it is possible to easily adapt the manufacturing technology for the control device in an ASIC to the manufacturing technology of the MOS transistor without taking up too much space compared with a standard operational amplifiers which for its part comprises approximately forty transistors.

Such a control device affords good stability in terms of temperature. This is because the functioning of such a device is always the same whether at 25° C. or 125° C. for example. This is by virtue of the fact that the structure of the first amplification stage PD is symmetrical.

The control device can withstand high voltages and thus measure high drain-source voltages, for example above 500V. This is because the protection diodes D9, D4 and D3 associated respectively with the feedback loop and the inputs of the amplification device make it possible to absorb these overvoltages, so that all the transistors are protected.

There exists no leakage current if the control device is off (Vcc=0V) so that the batteries do not discharge when the vehicle is at rest. This also by virtue of the protection diodes D4, D3 and D9.

The voltage measurement offset is fixed by a voltage source D7 and a resistance ratio R9/(R13+R7), or a current source and the first resistor R9, which involves a small drift in temperature of the control device. Consequently integration in an ASIC is easier. This is because, in an integrated circuit, there is a temperature drift that involves the silicon of the integrated circuit conducting more or less well as a function of temperature. To avoid this temperature drift, it is necessary to obtain a constant resistance ratio, the values of the resistances being able to vary, which is achieved by virtue of the device of the invention. On the other hand, with discrete components, it is necessary to obtain fixed resistance values, which is more difficult to achieve.

There is solely a positive supply Vcc referenced with respect to the node N for the entire device, which eliminates a supply compared with a case with a conventional operational amplifier requiring a negative additional supply. This supply may be common with the two-state control device of the transistor 4.

A positive reference voltage is obtained by means of a reference current and two resistors R9 and R18, which is easier to achieve than a negative reference voltage. In the latter case, it is in fact necessary to have two supply sources, one negative and one positive.

Control of the transistor 5 is achieved very rapidly. This is because the input of the drain voltage signal Vd directly enters the emitter of the bipolar transistor T1 of the differential pair PD. This makes it possible to obtain a low input impedance, a low gain and therefore a high bandwidth. The base current is low so that the collector current is equal to the emitter current ic=ie. Consequently, when the drain voltage Vd varies, the control current Icom varies. When the latter is high, it is not necessary to amplify it much in order to control the transistor 5, unlike an arrangement in which the drain voltage signal Vd enters the base of the bipolar transistor T1. In the latter case, the base current would be lower than the emitter current ib<ie and it would be necessary to amplify the control current Icom before driving the transistor 5.

Having biasing currents integrated in the amplification device avoids having additional current consumption on the supply Vcc over and above the inherent consumption of the amplification stages.

By virtue of the capacitance C8, it is possible to fix a maximum slope of variation on the gate-source output voltage Vgs, called in English "slew rate", so as to improve the stability of the control device.

The use of a resistance of around 100kΩ (R18) for the feedback loop instead of a high resistance of around 1MΩ can more easily be integrated in an ASIC. Moreover, when the control device is implemented in discrete components, if moisture infiltrates, it is good to have low resistances in order to avoid a variation in the said resistances because of the water.

Because of the protection diodes D4, D3 and D9, leakage currents are avoided. This has another advantage of avoiding oxidation of the phases of the alternator stator in the case of a bridge rectifier application, the alternator being in an often moist environment assisting corrosion. This is because, in the case of the presence of leakage currents, a difference in potential exists between the phase and the casing of the alternator connected to the vehicle earth.

This control device 10 prevents the negative effects (negative voltage on all the consumers) on the onboard system of a reversal of polarity of the battery 2. The voltage of the battery 2 becomes less than that of the battery 3, the transistor 5 opens then before a negative current flows.

The control device is simple and therefore can easily be integrated in an ASIC integrated circuit or directly on the same substrate as the MOS power transistor. It is also possible to put several control devices on the same substrate or in the same ASIC in order to control several MOS transistors (for example a device that controls a power bridge arm, or all the arms of the bridge, etc).

The invention claimed is:

1. A control device (10) for a power transistor (5) formed by a channel comprising a gate, a source and a drain, the control device comprising:
an amplification device (15) delivering an output control signal in order to control the gate of the power transistor (5), the amplification device comprising:
a first input (NEG) connected to the drain of the power transistor so as to form a first circuit portion; and
a second input (POS) connected to the source of the power transistor so as to form a second circuit portion;
means for producing a biasing current (I1, I2), the biasing current being injected into one of the first and second inputs (NEG, POS) so as to cause an offset in the drain-source voltage measurement and to preserve a linear operating mode for the output control signal before the power transistor opens;
equal number N of semiconductor junctions in the first and second circuit portions;
a protection device (D4) on the first circuit portion; and
a protection device (D3) on the second circuit portion.

2. The control device according to claim 1, further comprising a feedback loop (R9-R18) from an output of the amplification device to one of the first and second inputs (NEG, POS) thereof.

3. The control device according to claim 1, wherein the first input (NEG) is connected to the drain of the power transistor via a first resistor (R9).

4. The control device according to claim 1, wherein the junction or junctions on the first circuit portion is or are of the same of the nature as that or those on the second circuit portion.

5. The control device according to claim 1, wherein the number of semiconductor junctions N is equal to 0.

6. The control device according to claim 1, wherein the number of semiconductor junctions N is equal to 1.

7. The control device according to claim 1, further comprising two means for producing two biasing currents (I1, I2), the two biasing currents being injected at the inputs (NEG, POS) of the amplification device (15).

8. The control device according to claim 7, wherein the biasing current is integrated in the amplification device (15).

9. The control device according to claim 1, wherein the two biasing currents (I1, I2) pass respectively through the protection devices of the first and second circuit portions.

10. The control device according to claim 1, wherein the first input of the amplification device (15) is a negative input and the second input thereof is a positive input.

11. The control device according to claim 1, wherein the amplification device (15) comprises a first amplification stage (PD) for amplifying an input voltage (Vds+R9*I2) of the amplification device (15).

12. The control device according to claim 11, wherein the biasing current (I1, I2) passes through the first amplification stage (PD).

13. The control device according to claim 11, wherein the amplification device (15) comprises a second amplification stage (AS) for amplifying the voltage of the first amplification stage (PD).

14. The control device according to claim 1, wherein the amplification device (15) comprises an additional control stage (ON/OFF) for controlling the power transistor in two-state mode.

15. The control device according to claim 14, wherein the control stage (ON/OFF) in the two-state mode uses the third amplification stage (AT).

16. The control device according to claim 1, wherein the control device is implemented in an integrated circuit (ASIC).

17. A power bridge for a rotary electrical machine comprising power transistors associated with phases of a stator of the rotary electrical machine, each transistor (MOS) being controlled by a control device (10) according to claim 1.

18. A rotary electrical machine comprising a control device for controlling a power transistor according to claim 1.

19. A rotary electrical machine comprising a control device for controlling a power transistor according to claim 1 to control the rotary electrical machine in a motor mode.

20. A control device (10) for a power transistor (5) formed by a channel comprising a gate, a source and a drain, the control device comprising:
    an amplification device (15) delivering an output control signal in order to control the gate of the power transistor (5), the amplification device comprising:
        a first input (NEG) connected to the drain of the power transistor so as to form a first circuit portion; and
        a second input (POS) connected to the source of the power transistor so as to form a second circuit portion;
    means for producing a biasing current (I1, I2), the biasing current being injected into one of the first and second inputs (NEG, POS) so as to cause an offset in the drain-source voltage measurement and to preserve a linear operating mode for the output control signal before the power transistor opens;
    equal number N of semiconductor junctions in the first and second circuit portions;
    a feedback loop (R9-R18) from an output of the amplification device to one of the first and second inputs (NEG, POS) thereof; and
    a protection device (D9) on the feedback loop (16).

21. The control device according to claim 20, wherein the protection device (D9) comprises a diode.

22. The control device according to claim 20, wherein the protection device (D9) comprises a switch.

23. A control device (10) for a power transistor (5) formed by a channel comprising a gate, a source and a drain, the control device comprising:
    an amplification device (15) delivering an output control signal in order to control the gate of the power transistor (5), the amplification device comprising:
        a first input (NEG) connected to the drain of the power transistor so as to form a first circuit portion; and
        a second input (POS) connected to the source of the power transistor so as to form a second circuit portion;
    means for producing a biasing current (I1, I2), the biasing current being injected into one of the first and second inputs (NEG, POS) so as to cause an offset in the drain-source voltage measurement and to preserve a linear operating mode for the output control signal before the power transistor opens;
    equal number N of semiconductor junctions in the first and second circuit portions; and
    two means for producing two biasing currents (I1, I2), the two biasing currents being injected at the inputs (NEG, POS) of the amplification device (15); and
    the biasing currents (I1, I2) being produced by a current mirror.

24. The control device according to claim 23, wherein the biasing currents (I1, I2) are equal.

25. The control device according to claim 23, wherein the biasing currents are different.

26. A control device for controlling a power transistor (5) formed by a channel comprising a gate, a source and a drain, the control device comprising:
    an amplification device (15) delivering an output control signal in order to control the gate of the power transistor (5), the amplification device comprising:
        first input (NEG) connected to the drain of the power transistor so as to form a first circuit portion;
        a second input (POS) connected to the source of the power transistor so as to form a second circuit portion;
        a first amplification stage (PD) for amplifying an input voltage (Vds+R9*I2) of the amplification device (15);
        a second amplification stage (AS) for amplifying the voltage of the first amplification stage (PD); and
        a third amplification stage (AT) having a high current gain so as to quickly control the power transistor (5);
    means for producing a biasing current (I1, I2), the biasing current being injected into one of the first and second inputs (NEG, POS) so as to cause an offset in the drain-source voltage measurement and to preserve a linear operating mode for the output control signal before the power transistor opens; and
    equal number N of semiconductor junctions in the first and second circuit portions;
    the third amplification stage comprising a discharge circuit (DECH) for rapid discharge of the power transistor (5).

27. The control device according to claim 26, wherein the discharge circuit (DECH) comprises means (T20-T21-T22; D103-T20-R108) for discharging the gate of the power transistor (5) to substantially zero.

28. A control device for controlling a power transistor (5) formed by a channel comprising a gate, a source and a drain, the control device comprising:
    an amplification device (15) delivering an output control signal in order to control the gate of the power transistor (5), the amplification device comprising:
        first input (NEG) connected to the drain of the power transistor so as to form a first circuit portion;
        a second input (POS) connected to the source of the power transistor so as to form a second circuit portion;
        a first amplification stage (PD) for amplifying an input voltage (Vds+R9*I2) of the amplification device (15);
        a second amplification stage (AS) for amplifying the voltage of the first amplification stage (PD); and a third amplification stage (AT) having a high current gain so as to quickly control the power transistor (5);

means for producing a biasing current (I1, I2), the biasing current being injected into one of the first and second inputs (NEG, POS) so as to cause an offset in the drain-source voltage measurement and to preserve a linear operating mode for the output control signal before the power transistor opens; and equal number N of semiconductor junctions in the first and second circuit portions;

the third amplification stage (AT) comprising a circuit (CHAR) for charging the power transistor (5).

29. A system for managing two batteries for a motor vehicle, the system comprising:

a first battery and a second battery;

a control unit (1) comprising a control device (10) for a power transistor (5) formed by a channel comprising a gate, a source and a drain, the control unit provided to put the first and second batteries in parallel, the control device (10) comprising:

an amplification device (15) delivering an output control signal in order to control the gate of the power transistor (5), the amplification device comprising:

a first input (NEG) connected to the drain of the power transistor so as to form a first circuit portion; and a second input (POS) connected to the source of the power transistor so as to form a second circuit portion;

means for producing a biasing current (I1, I2), the biasing current being injected into one of the first and second inputs (NEG, POS) so as to cause an offset in the drain-source voltage measurement and to preserve a linear operating mode for the output control signal before the power transistor opens; and equal number N of semiconductor junctions in the first and second circuit portions.

30. The system according to claim 29, wherein the control device (10) comprises a control for the power transistor (5) in two-state mode.

\* \* \* \* \*